US009263282B2

(12) United States Patent
Lin et al.

(10) Patent No.: US 9,263,282 B2
(45) Date of Patent: Feb. 16, 2016

(54) METHOD OF FABRICATING SEMICONDUCTOR PATTERNS

(71) Applicant: UNITED MICROELECTRONICS CORPORATION, Hsinchu (TW)

(72) Inventors: Chin-Fu Lin, Tainan (TW); Chih-Chien Liu, Taipei (TW); Chia-Lin Hsu, Tainan (TW); Chin-Cheng Chien, Tainan (TW); Chun-Yuan Wu, Yunlin County (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 435 days.

(21) Appl. No.: 13/916,584

(22) Filed: Jun. 13, 2013

(65) Prior Publication Data

US 2014/0370701 A1   Dec. 18, 2014

(51) Int. Cl.
*H01L 21/31* (2006.01)
*H01L 21/306* (2006.01)
*H01L 21/308* (2006.01)
*H01L 29/66* (2006.01)

(52) U.S. Cl.
CPC .......... *H01L 21/306* (2013.01); *H01L 21/3086* (2013.01); *H01L 21/3088* (2013.01); *H01L 29/66795* (2013.01); *H01L 29/66818* (2013.01)

(58) Field of Classification Search
CPC ............... H01L 21/0337; H01L 29/785; H01L 21/3086; H01L 21/31144; H01L 21/32139; H01L 27/0886; H01L 29/6656; H01L 29/6681; H01L 21/02164; H01L 21/308; H01L 21/3081; H01L 21/845; H01L 29/6653
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 6,960,509 B1 * | 11/2005 | Han | H01L 29/66818 257/E21.285 |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon | |

(Continued)

OTHER PUBLICATIONS

Internal UMC invention disclosure document, 13 pages, confidential document.

*Primary Examiner* — Bac Au
(74) *Attorney, Agent, or Firm* — Ding Yu Tan

(57) ABSTRACT

A method of fabricating semiconductor patterns includes steps as follows: Firstly, a substrate is provided and has at least a first semiconductor pattern and at least a second semiconductor pattern, wherein a line width of the first semiconductor pattern is identical to a line width of the second semiconductor pattern. Then, a barrier pattern is formed over a surface of the first semiconductor pattern, and the second semiconductor pattern is exposed. Then, a surface portion of the second semiconductor pattern is reacted to form a sacrificial structure layer. Then, the barrier pattern and the sacrificial structure layer are removed, and the line width of the second semiconductor pattern is shrunken to be less than the line width of the first semiconductor pattern. A third semiconductor pattern having a line width can be further provided.

13 Claims, 6 Drawing Sheets

(56) References Cited

U.S. PATENT DOCUMENTS

| | | | | |
|---|---|---|---|---|
| 7,754,622 B2* | 7/2010 | Chou | H01L 21/0337 | 438/786 |
| 7,858,516 B2* | 12/2010 | Jeong | H01L 21/0337 | 257/E21.582 |
| 7,947,589 B2* | 5/2011 | Muralidhar | H01L 21/3086 | 216/2 |
| 7,994,583 B2* | 8/2011 | Inaba | G11C 11/412 | 257/369 |
| 8,247,291 B2* | 8/2012 | Min | H01L 21/0337 | 257/E21.538 |
| 8,921,189 B2* | 12/2014 | Yu | H01L 27/1052 | 438/299 |
| 9,153,440 B2* | 10/2015 | Lin | H01L 21/0337 | |
| 2004/0195624 A1 | 10/2004 | Liu | | |
| 2005/0051825 A1 | 3/2005 | Fujiwara | | |
| 2006/0099830 A1 | 5/2006 | Walther | | |
| 2006/0216923 A1 | 9/2006 | Tran | | |
| 2006/0286729 A1 | 12/2006 | Kavalieros | | |
| 2007/0108528 A1 | 5/2007 | Anderson | | |
| 2007/0158756 A1 | 7/2007 | Dreeskornfeld | | |
| 2008/0157208 A1 | 7/2008 | Fischer | | |
| 2009/0124097 A1 | 5/2009 | Cheng | | |
| 2009/0242964 A1 | 10/2009 | Akil | | |
| 2009/0269916 A1 | 10/2009 | Kang | | |
| 2010/0048027 A1 | 2/2010 | Cheng | | |
| 2010/0072553 A1 | 3/2010 | Xu | | |
| 2010/0144121 A1 | 6/2010 | Chang | | |
| 2010/0167506 A1 | 7/2010 | Lin | | |
| 2013/0093026 A1* | 4/2013 | Wann | H01L 21/823821 | 257/401 |
| 2013/0143372 A1* | 6/2013 | Kim | H01L 21/3081 | 438/163 |
| 2013/0244392 A1* | 9/2013 | Oh | H01L 29/66477 | 438/299 |
| 2013/0270559 A1* | 10/2013 | Hafez | H01L 27/11206 | 257/50 |
| 2014/0077296 A1* | 3/2014 | Yamashita | H01L 21/823431 | 257/347 |
| 2014/0308761 A1* | 10/2014 | Kuo | H01L 21/3086 | 438/5 |

* cited by examiner

METHOD OF FABRICATING SEMICONDUCTOR PATTERNS

FIELD OF THE INVENTION

The present invention relates to a method of fabricating semiconductor structures, and more particularly to a method of fabricating semiconductor patterns.

BACKGROUND OF THE INVENTION

In the sub-nanometer generation of fabrication process of a semiconductor device, one demand is to shrink a line width of the semiconductor device and to obviate a short channel effect therein, and another demand is to increase a response speed and to reduce power consumption thereof. In order to meet the above demands, a semiconductor device having a broader channel width such as a FIN field effect transistor (FINFET) is a solution. However, in the case of obtaining a functional circuit that needs to fabricate at least one of plural nanometer-scale semiconductor devices formed in a substrate having a differentiated spatial channel width from others, one aspect is to overcome a resolution limitation of conventional lithography processes, and another aspect is to maintain a pattern integrity of the spatial channels of the plural nanometer-scale semiconductor devices.

Therefore, there is a need of providing an improved method of fabricating nanometer-scale spatial semiconductor devices having differentiated line widths.

SUMMARY OF THE INVENTION

In accordance with an aspect, the present invention provides a method of fabricating semiconductor patterns includes steps as follows. Firstly, a substrate is provided and has at least a first semiconductor pattern and at least a second semiconductor pattern formed thereon, wherein a line width of the first semiconductor pattern is identical to a line width of the second semiconductor pattern. Then, a barrier pattern is formed over a surface of the first semiconductor pattern, and the second semiconductor pattern is exposed. Then, a surface portion of the second semiconductor pattern is reacted to form a sacrificial structure layer. Then, the barrier pattern and the sacrificial structure layer are removed, and the line width of the second semiconductor pattern is shrunken to be less than the line width of the first semiconductor pattern.

In accordance with the present invention, the sacrificial structure layer is formed with the reacted surface portion of the second semiconductor pattern and removed without damage on the second semiconductor pattern, so that a fine shrunk pattern of the second semiconductor pattern can be obtained. Consequently, the first semiconductor pattern and the second semiconductor pattern having differentiated line widths can be used for fabricating nanometer-scale spatial semiconductor devices having high electricity performance.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Firstly, FIGS. 1A~1D are schematic cross-sectional views illustrating a partial process flow of a method of fabricating semiconductor patterns according to an embodiment of the present invention.

Figure 1A:
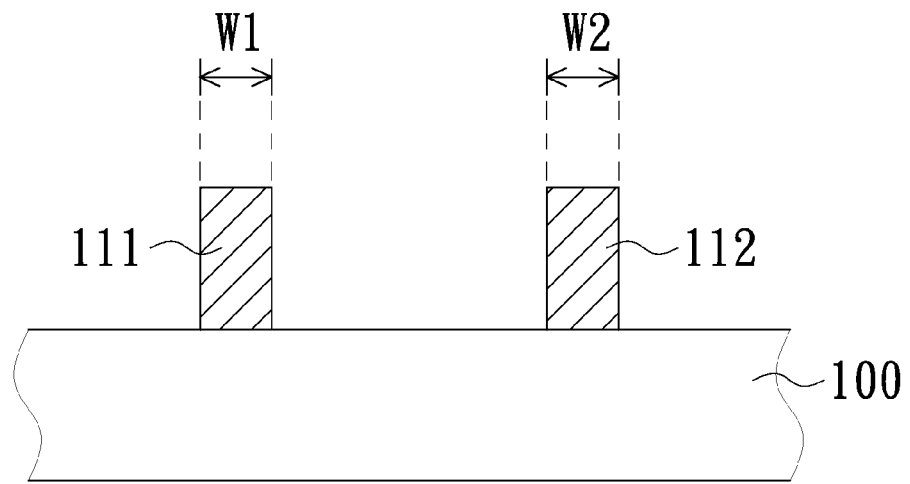
FIGS. 1A~1D are schematic cross-sectional views illustrating a partial process flow of a method of fabricating semiconductor patterns according to an embodiment of the present invention.

Please refer to FIG. 1A, a substrate 100 is provided, and has at least a first semiconductor pattern 111 and at least a second semiconductor pattern 112 formed thereon, wherein a line width w1 of the first semiconductor pattern 111 is identical to a line width w2 of the second semiconductor pattern 112, and a line length of the first semiconductor pattern 111 can be different from or identical to a line length of the second semiconductor pattern 112. The substrate 100 can be made of material selected from bulk silicon (Si) substrate, silicon on insulator (SOI), germanium (Ge) substrate or other semiconductor substrate with P-doped, N-doped or intrinsic semiconductor, but not limited thereto in the present invention. In this embodiment, a step of forming the first semiconductor pattern 111 and the second semiconductor pattern 112 can be performed under different sub-steps, including for example: patterning a semiconductor layer formed on an insulator of SOI, or forming a protecting layer (not shown), for example: an oxide or a nitride layer, over the substrate 100 followed by forming a semiconductor layer on the protecting layer with a semiconductor material, for example: silicon, silicon-germanium, silicon-carbon or germanium-carbon; and then patterning the semiconductor layer to form the first semiconductor pattern 111 and the second semiconductor pattern 112. In this embodiment, a material for forming the first semiconductor pattern 111 and the second semiconductor pattern 112 is silicon.

Figure 1B:
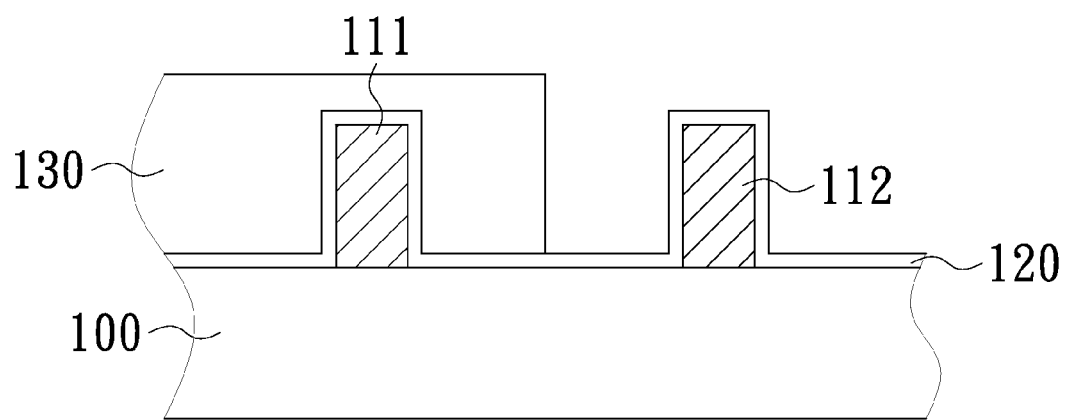

Then, as shown in FIG. 1B, a first material layer 120, e.g. oxide, nitride, oxynitride or carbide, is formed over and conformal to a surface of the first semiconductor pattern 111 and the second semiconductor pattern 112 by performing an atomic layer deposition process. Then, a mask 130 is formed above the first semiconductor pattern 111 by performing a conventional lithography process, wherein a material for forming the mask 130 has a considerable etching selectivity to a material for forming the first material layer 120, for example: the material of the mask 130 is photo resist and the material of the first material layer 120 is silicon oxide in this embodiment.

Figure 1C:
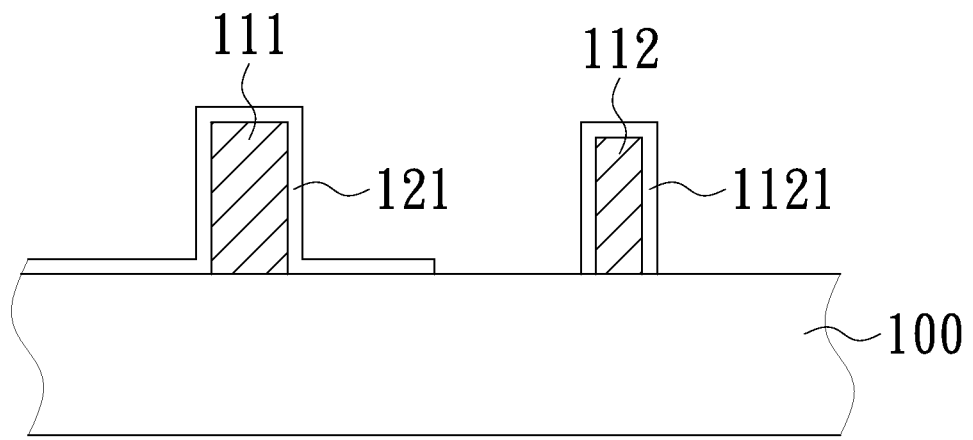

Then, as shown in FIG. 1C, after a portion of the first material layer 120 is removed, a barrier pattern 121 is formed over the surface of the first semiconductor pattern 111 with a remaining portion of the first material layer, and the second semiconductor pattern 112 is exposed. Then, after or combined with a step of removing the mask 130, a surface portion of the second semiconductor pattern 112 is reacted to form a sacrificial structure layer 1121 by performing an oxidation, a nitridation, an oxynitridation or a carbonation reaction, and a material of the sacrificial structure layer 1121 and the material for forming the barrier pattern 121, i.e. the first material layer 120, can be consistently removed with an etching formula. In this embodiment, the material for forming the barrier pattern 121 is silicon oxide, the surface portion of the second semiconductor pattern 112 is reacted with an oxidant, e.g. a diluted sulfuric acid or hydrogen peroxide solution, for use in removing the mask 130 to form the sacrificial structure layer 1121 made of silicon oxide, so that the barrier pattern 121 and the sacrificial structure layer 1121 can be consistently removed with an etching formula. It is noted that a thickness and a uniformity of the sacrificial structure layer 1121 formed by the reaction can be obtained by adjusting reaction conditions thereof, e.g. temperature, time or reactant, in the present invention.

Figure 1D:
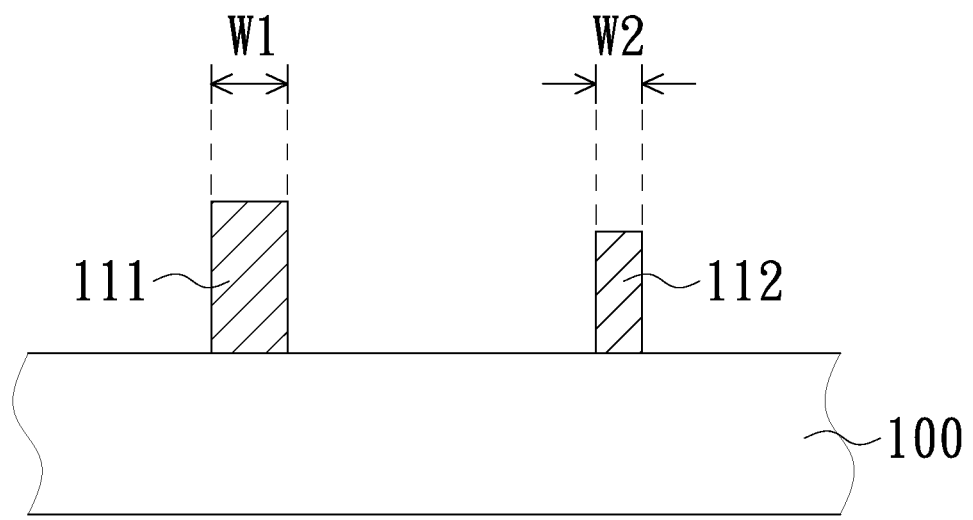

Then, as shown in FIG. 1D, after the barrier pattern and the sacrificial structure layer are removed, the line width w2 of the second semiconductor pattern 112 is shrunken to be less than the line width w1 of the first semiconductor pattern 111. Since the line width w2 of the second semiconductor pattern 112 can be controlled by adjusting the thickness of the sacrificial structure layer 1121, the barrier pattern and the sacrificial structure layer can be removed without damaging the first semiconductor pattern 111 and the second semiconductor pattern 112, and then a pattern integrity of differentiated semiconductor patterns can be obtained. According to the present invention, the first semiconductor pattern 111 and the second semiconductor pattern 112 having differentiated line widths can either be use for fabricating spatial semiconductor devices or patterning another semiconductor layer to form plural nanometer-scale semiconductor devices.

Secondly, FIGS. 2A~2G are schematic cross-sectional views illustrating a partial process flow of a method of fabricating semiconductor patterns according to another embodiment of the present invention.

Figure 2A:
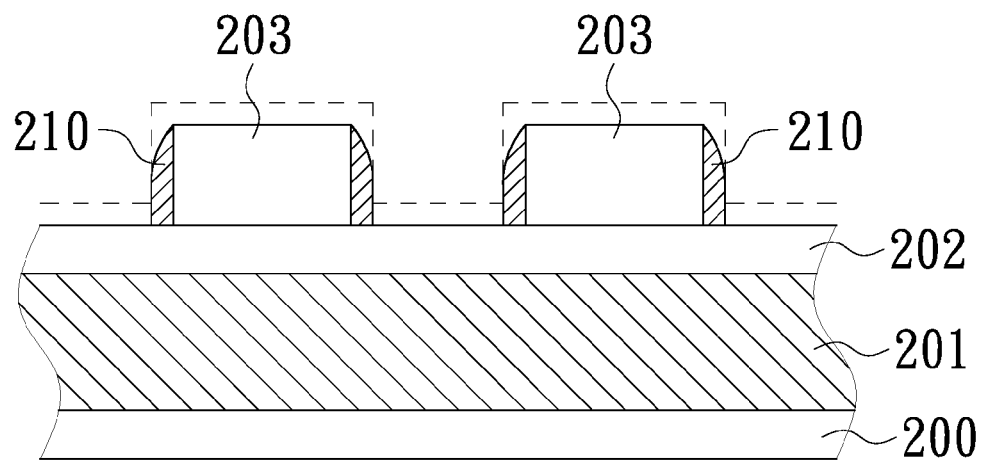
FIGS. 2A~2G are schematic cross-sectional views illustrating a partial process flow of a method of fabricating semiconductor patterns according to another embodiment of the present invention.

Please refer to FIG. 2A, a substrate 200 is provided and includes a silicon layer 201 formed thereon and a protection layer 202 formed atop the silicon layer 201. At least one dummy structure 203 is formed on the protection layer 202. A semiconductor layer (shown as a dash line) is formed on the dummy structure 203 and the protection layer 202, wherein each of the protection layer 202, the dummy structure 203 and the semiconductor layer has an etching selectivity with respect to the other material layers, for example: a material for forming the protection layer is silicon nitride, a material for forming the dummy structure is silicon oxide and a material for forming the semiconductor layer is silicon. A portion of the semiconductor layer is removed by performing an anisotropic etching process with the protection layer 202 being used as an etching stop layer, and then a spacer layer 210 is formed with a remaining portion of the semiconductor layer on a sidewall of the dummy structure 203.

Figure 2B:
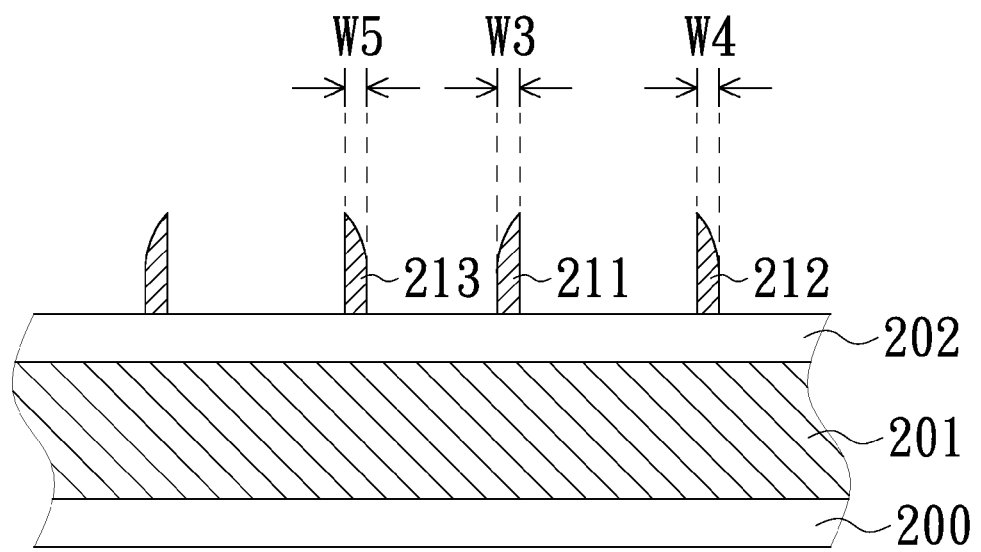

Then, as shown in FIG. 2B, after the dummy structure is removed, a plurality of semiconductor patterns is formed with the spacer layer 210 (shown in FIG. 2A) and at least includes a first, a second and a third semiconductor pattern 211, 212 and 213, wherein a line width w3, w4 and w5 of the first, the second and the third semiconductor pattern 211, 212 and 213 are identical, and each line length of the first, the second and the third semiconductor pattern 211, 212 and 213 can be different from or identical to one another. In this embodiment, the line width w3, w4 and w5 of the first, the second and the third semiconductor pattern 211, 212 and 213 can be controlled by adjusting a thickness of the semiconductor layer formed thereon or etching conditions of the anisotropic etching process.

For the sake of brevity, only the first, the second and the third semiconductor pattern 211, 212 and 213 formed above the substrate 200 are illustrated in FIGS. 2C~2F.

Figure 2C:
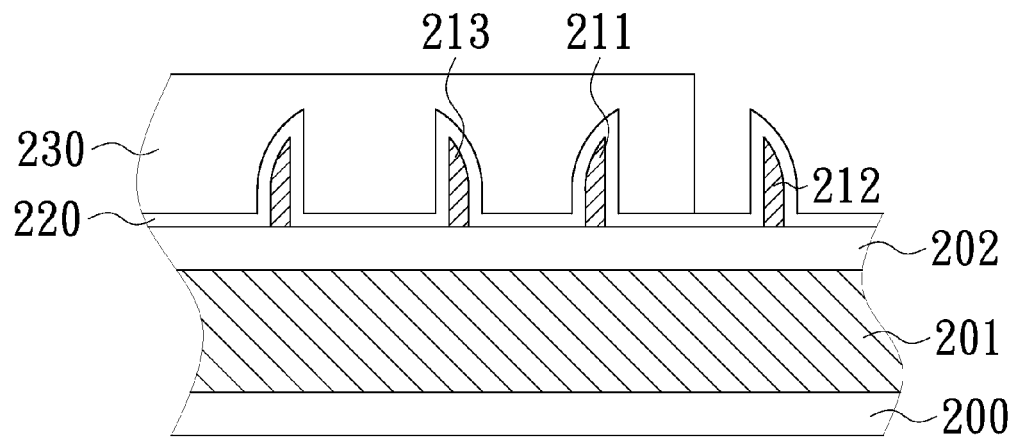
Figure 2D:
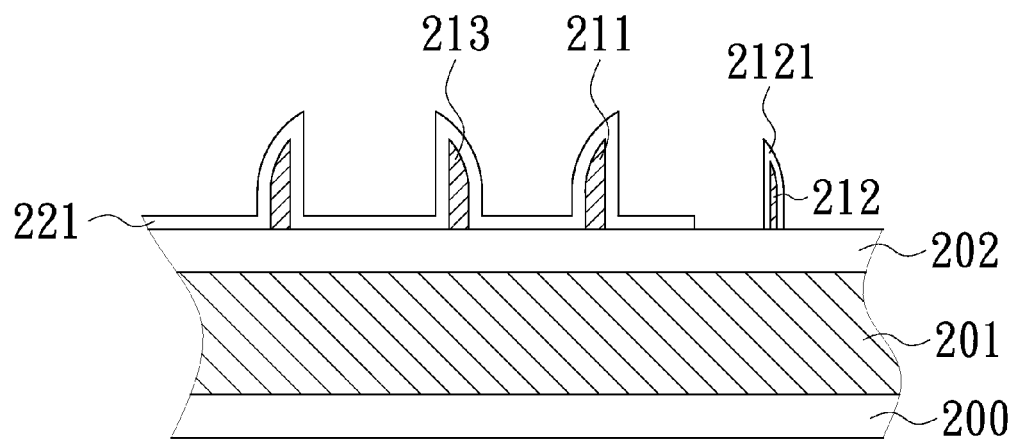

Then, as shown in FIG. 2C, for the step described in the above embodiment, a first material layer 220 is formed over and conformal to a surface of the first, second and the third semiconductor pattern 211, 212 and 213, respectively. Then, a mask 230 is formed above the first and third semiconductor pattern 211 and 213. As shown in FIG. 2D, after a portion of the first material layer is removed, a barrier pattern 221 is formed over the surface of the first and third semiconductor pattern 211 and 213 with a remaining portion of the first material layer, and the second semiconductor pattern 212 is left exposed. Then, after or combined with a step of removing the mask 230 (shown in FIG. 2C), a surface portion of the second semiconductor pattern 212 is reacted to form a sacrificial structure layer 2121. A material of the sacrificial structure layer 2121 and the material for forming the barrier pattern 221 can be consistently removed with an etching formula, and the material for forming the protection layer 202 has an etching selectivity with respect or relative to the material for forming the barrier pattern 221 or to the material of the sacrificial structure layer 2121; for example: the material for forming the protection layer 202 is silicon nitride, the material for forming the barrier pattern 221 is silicon oxide and the material of the sacrificial structure layer 2121 is silicon oxide.

Figure 2E:
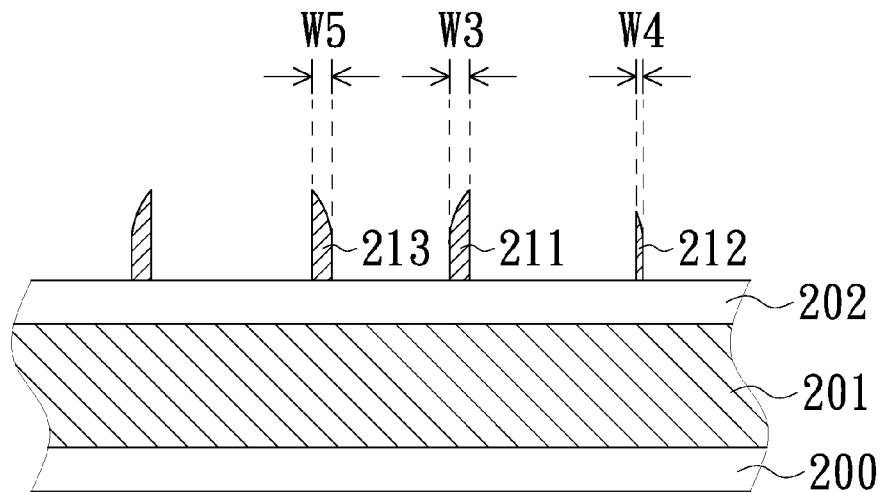

Then, as shown in FIG. 2E, the barrier pattern and the sacrificial structure layer can be consistently removed with an etching formula, and the line width w4 of the second semiconductor pattern 212 is shrunken to be less than the line width w3 and w5 of the first and the third semiconductor pattern 211 and 213, respectively. In some embodiments (not shown) according to the present invention, the steps of shrinking the line width of the semiconductor pattern in this embodiment can be performed more than once to be described as follow; for example: a second barrier pattern (not shown) is formed over a surface of the third semiconductor pattern 213, then exposing the first semiconductor pattern 211 and the second semiconductor pattern 212 are exposed; a surface portion of the first semiconductor pattern 211 and a surface portion of the second semiconductor pattern 212 are allowed to be reacted to form a second sacrificial structure layer (not shown); and the second barrier pattern and the second sacrificial structure layer are removed, so as to allow the line width w4 of the second semiconductor pattern 212 to be shrunken less than the line width w3 of the first semiconductor pattern 211, and the line width w3 of the first semiconductor pattern 211 to be shrunken less than the line width w5 of the third semiconductor pattern 213; and the other steps as found in this or above embodiment are not described herein for the sake of brevity. It is noted that the line width w3, w4 and w5 of the first, the second and the third semiconductor pattern 211, 212 and 213 can overcome the limitations of conventional lithography processes and able to reach dimensions at less than 50 nanometers or even less than 30 nanometers.

Figure 2F:
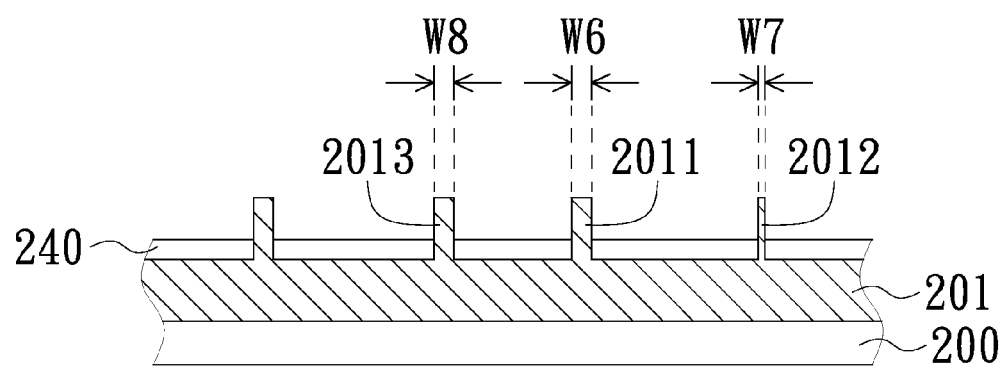

Then, as shown in FIG. 2F, the protection layer 202 and the silicon layer 201 (shown in FIG. 2E) are patterned with the first, the second and the third semiconductor pattern 211, 212 and 213 serving or acting as patterned masks to form a first silicon pattern 2011, a second silicon pattern 2012 and a third silicon pattern 2013, wherein a line width w7 of the second silicon pattern 2012 is less than a line width w6 of the first silicon pattern 2011 and a line width w8 of the third silicon pattern 2013. It is noted that the line width w6, w7 and w8 of the first, the second and the third silicon pattern 2011, 2012 and 2013 (corresponding and) according to the line width w3, w4 and w5 of the first, and the second and the third semiconductor pattern 211, 212 and 213 (shown in FIG. 2E) can be less than 50 nanometers or even 30 nanometers. The first, the second and the third silicon pattern 2011, 2012 and 2013 can be used for fabricating a plurality of spatial semiconductor devices having differentiated line widths. Then, please refer to FIG. 2F again, an insulation layer 240 is formed over the first, the second and the third silicon pattern 2011, 2012 and 2013, then the insulation layer 240 is polished, and a portion of the insulation layer 240 is etched back to expose a portion of the surface of the first, the second and the third silicon pattern 2011, 2012 and 2013.

Figure 2G:
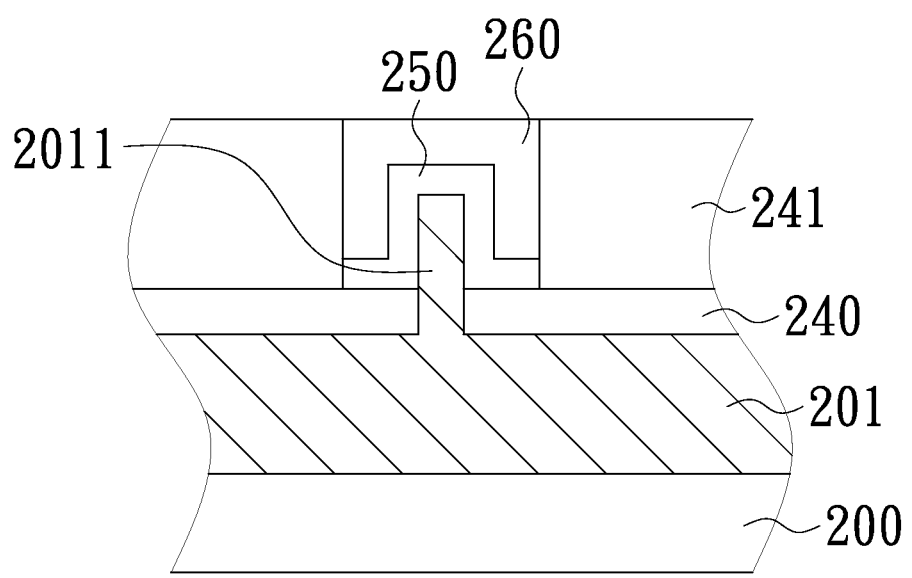

For a brief description, only the first silicon pattern 2011 formed with the insulation layer 240 on the substrate 200 is being illustrated in FIG. 2G.

As shown in FIG. 2G, a dielectric layer (not shown) is formed on a portion of the exposed portion of the first silicon pattern 2011, and a dummy gate (not shown) is formed on the dielectric layer. Then, a spacer (not shown) is formed on a sidewall of the dummy gate, and a source/drain region of the first silicon pattern 2011 is formed by performing implantation processes using the dummy gate and the spacer as doping masks. After a second insulation layer 241 is formed over the first silicon pattern 2011, the dummy gate and the spacer, the second insulation layer 241 is polished to expose the dummy gate. After the dummy gate and the dielectric layer are removed, a portion of the first silicon pattern 2011 is exposed, a gate dielectric layer 250 is formed on the exposed portion of the first silicon pattern 2011 with high dielectric constant material, e.g. zirconium dioxide or hafnium oxide, and a metal gate 260 is formed on the gate dielectric layer 250 with a conductive material, e.g. titanium or titanium nitride. Then a FINFET can be fabricated with the first silicon pattern 2011 having the source/drain region and the metal gate 260 formed therein.

According the above description, the present invention provides a method of fabricating semiconductor patterns for use in a substrate having at least a first semiconductor pattern and at least a second semiconductor pattern formed thereon, wherein a line width of the first semiconductor pattern is identical to a line width of the second semiconductor pattern. Due to having a sacrificial structure layer formed by reacting a surface portion of the second semiconductor pattern, and combining with the fact that the sacrificial structure layer can be removed without damage on the second semiconductor pattern, a shrunken fine pattern of the second semiconductor pattern can be obtained. Consequently, the first semiconductor pattern and the second semiconductor pattern having differentiated line widths can be used for fabricating nanometer-scale spatial semiconductor devices having higher electrical performance.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of fabricating semiconductor patterns, comprising steps as follows:
   providing a substrate, wherein the substrate comprises a silicon layer formed thereon and a protection layer formed atop the silicon layer;
   forming a dummy structure on the protection layer,
   forming a spacer layer on a sidewall of the dummy structure with a semiconductor material;
   removing the dummy structure;
   forming at least a first semiconductor pattern and at least a second semiconductor pattern with the spacer layer on the protection layer, wherein a line width of the first semiconductor pattern is identical to a line width of the second semiconductor pattern;
   forming a barrier pattern over a surface of the first semiconductor pattern, and exposing the second semiconductor pattern;
   forming a sacrificial structure layer by reacting a surface portion of the second semiconductor pattern; and
   removing the barrier pattern and the sacrificial structure layer to obtain the line width of the second semiconductor pattern configured to be less than the line width of the first semiconductor pattern.

2. The method of fabricating semiconductor patterns according to claim 1, wherein a material for forming the protection layer has an etching selectivity with respect to a material for forming the dummy structure, a material for forming the barrier pattern or a material of the sacrificial structure layer.

3. The method of fabricating semiconductor patterns according to claim 2, wherein the material for forming the protection layer is silicon nitride, the material for forming the dummy structure and the barrier pattern is silicon oxide, and the material of sacrificial layer is silicon oxide.

4. The method of fabricating semiconductor patterns according to claim 1, further comprising steps as follows:
   patterning the protection layer and the silicon layer with the first semiconductor pattern and the second semiconductor pattern acting as a patterned mask to form a first silicon pattern and a second silicon pattern, wherein a line width of the second silicon pattern is less than a line width of the first silicon pattern;
   forming an insulation layer over the first silicon pattern and the second silicon pattern, then polishing the insulation layer;
   etching back a portion of the insulation layer to expose a portion of the surface of the first silicon pattern and a portion of the surface of the second silicon pattern;
   forming a gate dielectric layer on the exposed portion of the surface of the first silicon pattern and the exposed portion of the surface of the second silicon pattern; and
   forming a metal gate on the gate dielectric layer.

5. The method of fabricating semiconductor patterns according to claim 4, wherein the line width of the first silicon pattern and the line width of the second silicon pattern are not greater than 50 nanometers.

6. The method of fabricating semiconductor patterns according to claim 1, wherein the step of forming the barrier pattern over the surface of the first semiconductor pattern comprises sub-steps as follows:
   forming a first material layer over the first semiconductor pattern and the second semiconductor pattern by performing an atomic layer deposition process; and
   forming a mask above the first semiconductor pattern, then removing a portion of the first material layer to expose the second semiconductor pattern.

7. The method of fabricating semiconductor patterns according to claim 6, a material for forming the barrier pattern is selected from oxide, nitride, oxynitride or carbide.

8. The method of fabricating semiconductor patterns according to claim 6, wherein a material for forming the mask is a photo resist.

9. The method of fabricating semiconductor patterns according to claim 6, wherein a material for forming the first material layer is an oxide, the surface portion of the second semiconductor pattern is reacted with an oxidant for use in removing the mask to form the sacrificial structure layer, and the first material layer and the sacrificial structure layer are removed with an etching formula.

10. The method of fabricating semiconductor patterns according to claim 1, wherein the step of forming the sacrificial structure layer by reacting the surface portion of the second semiconductor pattern comprises performing an oxidation, a nitridation, an oxynitridation or a carbonation reaction, and the sacrificial structure layer and the barrier pattern are removed with an etching formula.

11. The method of fabricating semiconductor patterns according to claim 1, wherein the substrate further has at least a third semiconductor pattern formed thereon, a line width of the third semiconductor pattern is identical to the line width of the first semiconductor pattern, after the barrier pattern is formed over the first semiconductor pattern and the third semiconductor pattern, then the second semiconductor pattern is exposed, and the barrier pattern and the sacrificial structure layer are removed, the method further comprises steps as follows:

forming a second barrier pattern over a surface of the third semiconductor pattern, then exposing the first semiconductor pattern and the second semiconductor pattern;

forming a second sacrificial structure layer by reacting a surface portion of the first semiconductor pattern and a surface portion of the second semiconductor pattern; and removing the second barrier pattern and the second sacrificial structure layer to obtain the line width of the second semiconductor pattern configured to be less than the line width of the first semiconductor pattern and the line width of the first semiconductor pattern configured to be less than the line width of the third semiconductor pattern.

12. The method of fabricating semiconductor patterns according to claim 11, wherein a material for forming the second barrier pattern is selected from oxide, nitride, oxynitride or carbide.

13. The method of fabricating semiconductor patterns according to claim 11, wherein the step of forming the second sacrificial structure layer by reacting the surface portion of the second semiconductor pattern comprises performing an oxidation, a nitridation, an oxynitridation or a carbonation reaction, and the second sacrificial structure layer and the second barrier pattern are removed with an etching formula.

* * * * *